United States Patent [19]
Woith et al.

[11] Patent Number: 5,461,326
[45] Date of Patent: Oct. 24, 1995

[54] SELF LEVELING AND SELF TENSIONING MEMBRANE TEST PROBE

[75] Inventors: Blake F. Woith, Orange; John S. Szalay, Corona Del Mar, both of Calif.

[73] Assignee: Hughes Aircraft Company, Los Angeles, Calif.

[21] Appl. No.: 23,189

[22] Filed: Feb. 25, 1993

[51] Int. Cl.⁶ .............................. G01R 1/04; G01R 1/06; G01R 31/02
[52] U.S. Cl. ........................ 324/758; 324/73.1; 439/66; 439/73; 439/482
[58] Field of Search ............................ 324/158 F, 158 R, 324/158 P; 439/73, 74, 75, 76, 77, 482, 842

[56] References Cited

U.S. PATENT DOCUMENTS

| | | | |
|---|---|---|---|
| 4,636,722 | 1/1987 | Ardezzone | 324/158 P |
| 4,906,920 | 3/1990 | Huff et al. | 324/158 P |
| 5,334,029 | 8/1994 | Akkapeddi et al. | 439/73 |

*Primary Examiner*—Kenneth A. Wieder
*Assistant Examiner*—Barry C. Bowser
*Attorney, Agent, or Firm*—Elizabeth E. Leitereg; Terje Gudmestad; W. K. Denson-Low

[57] ABSTRACT

A test probe including a flexible membrane (12) having an array of test probe contacts (14) capable of softly and gently contacting pads on a device under test is provided with a structure that effectively applies tension to the membrane while at the same time automatically leveling the membrane and removing distortions. A small pressure plate (30) is bonded to the inner surface of the membrane behind the test probe contacts. A pressure post (58) having a pointed or rounded end (64) is pressed against the pressure plate (30a) and makes pivotal contact with the plate. A spring (50) including an adjustment screw (56) that axially adjusts the compression of the spring, applies pressure through the pivot point to the pressure plate and thus to the membrane at its test probe contacts. When the probe contacts (14) are pressed against a device to be tested, the probe contacts and pressure plate (30) rotate about the pivot point (64) of the pressure post (58), and thereby both planarize the test probe contact array (14) and level the test contact array while appropriately tensioning the membrane.

11 Claims, 1 Drawing Sheet

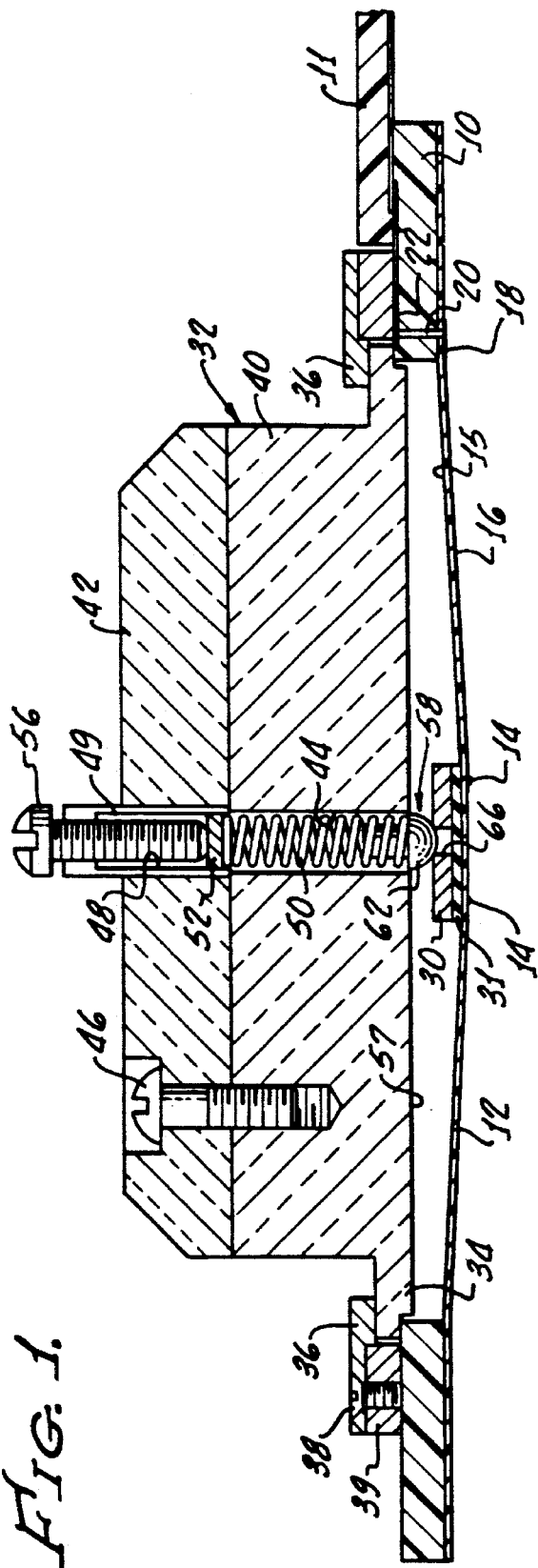
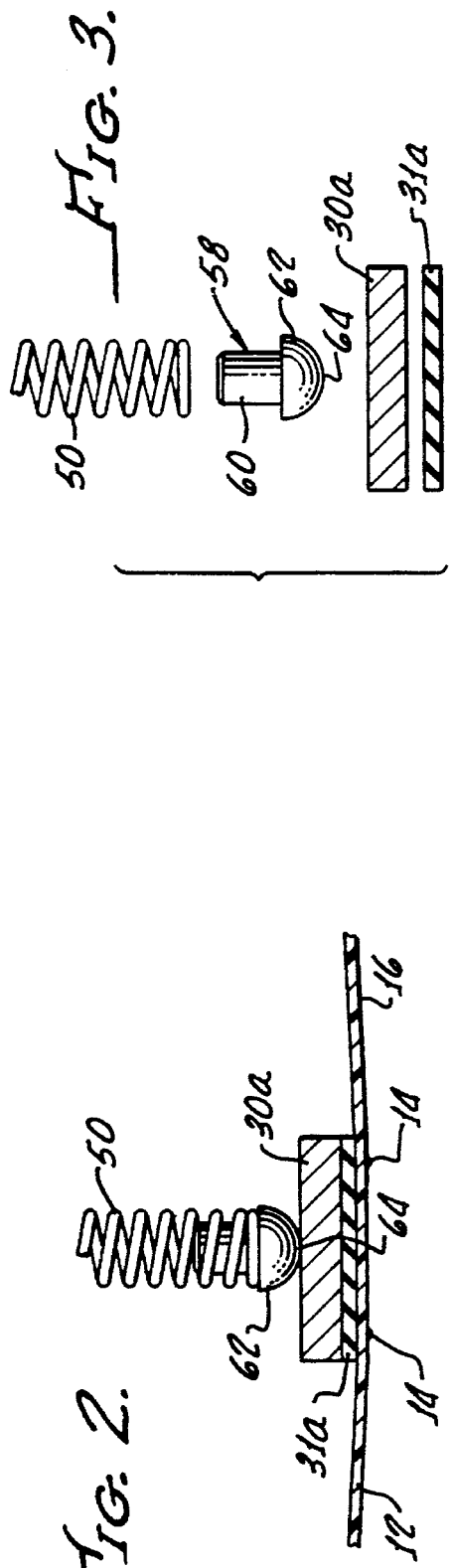

SELF LEVELING AND SELF TENSIONING MEMBRANE TEST PROBE

BACKGROUND OF THE INVENTION

1. Field of the Invention

The present invention relates to the testing of integrated circuit chips and wafers and more particularly concerns a test probe that is self-leveling and appropriately tensioned.

2. Description of Related Art

Integrated circuit chips are manufactured with large numbers of identical circuits on a single wafer which ultimately are separately cut from the wafer for use. It is desirable to test each circuit individually to determine whether or not it functions as intended before separating it from the wafer. Additional testing of separated circuits may be desired at various stages in assembly of the circuit in the finished apparatus. Further testing may be accomplished after packaging a circuit, after placing it in a multi-chip module and after disassembly of a multi-chip module to identify inoperable circuits.

Conventional testing employs a probe card that is provided with a large number of small tungsten blades or needles that are mechanically and electrically connected to a circuit board and act as test probe contacts. Electrical leads extend from the contacts to the outer edge of the board for connecting the probe card to test circuitry. In use the blades or needles are moved into engagement with the pads of an integrated circuit. The motion has to be such that there is a slight scrubbing action that is required for breaking through oxidation coating that often covers an aluminum integrated circuit chip pad. Thus, blades or needles are frequently positioned at an angle so that they will effectively slide along or scrub a surface of the pad to break the oxide coating. This provides an electrical connection so that signals can be read to determine integrity of the circuit on the chip.

Ends of the test needles or blades must all fall in the same plane in order to assure that each one makes electrical contact with a pad of the integrated circuit. This is accomplished by bending the blades or needles after they are mounted on the probe card, which is laborious, time consuming and expensive. Even after such adjustment, the blades or needles tend to creep back toward their original position so that their adjusted locations are lost. This loss of adjustment also comes about from the pressure of the needles against the chips, aggravated by the scrubbing action used to assure penetration of an oxide coating. As a result, constant maintenance is necessary or the probe cards will not perform their intended function. Even when in proper adjustment the needles cannot compensate for significant differences in the heights of the contact pads on the integrated circuit chips being tested. The close spacing necessary for testing some chips cannot be achieved with conventional needle contacts. The needles may also apply excessive force against the chip so as to damage the chips or their contract pads. This problem is greatly magnified by the fact that a single chip may require testing at different stages in its assembly into a finished module. In fact, some specifications will limit the number of times that a single chip can be tested in order to avoid excessive chip damage caused by the testing operation itself.

Improved testing arrangements are disclosed in a co-pending application, Ser. No. 606,676, filed Oct. 31, 1991, by John Pasiecznik, Jr. for Method and Apparatus for Testing Integrated Circuits (Attorney Docket Nos. PD-90358, 76-242-D), and in a co-pending application Ser. No. 752,422, filed Aug. 30, 1991 by Blake F. Woith and William R. Crumly for Rigid Flex Circuits With Raised Features as IC Test Probes (Attorney Docket Nos. PD-91297, 83-171-D). Both of these applications are assigned to the same assignee as that of this application, and both are incorporated herein by reference as though fully set forth.

In the above-identified application of John Pasiecznik, Jr. a flexible membrane is stretched across a rigid annular substrate and provided with raised features on one side which connect through conductive circuit traces to a probe card that is in turn connected to the test circuitry. During use of the membrane probe for testing, the membrane is distended by air pressure, and contact of the membrane with the integrated circuit under test deflects the membrane to ensure that raised contacts formed on the membrane are pressed against the pads of the integrated circuit to provide an electrical connection. Deflection of the membrane during testing creates a desired wiping action. Electrical traces are also formed on the membrane to electrically connect the raised probe test contacts to test circuitry.

It is important in the use of the membrane test probe that the membrane itself be properly tensioned and configured, because the membrane, which is effectively stretched across the inner area of a annular support, tends to sag or stretch in a haphazard manner. Moreover, because test probe contacts or contact pads on a device to be tested are not all of the same height, good electrical contact may not be accomplished between all test probe contacts and all contact pads of the device under test. Further, because of the curvature of the membrane, the plane of the group of probe test contacts carried by the membrane may not be precisely parallel to the plane of the contact pads of the device under test. Moreover, the test apparatus and the device under test are not necessarily precisely parallel with one another so that the plane of the probe test contacts may be at times slightly inclined to the plane of the contact pads of the device under test.

Accordingly, it is an object of the present invention to provide a membrane test probe that avoids or minimizes above mentioned problems.

SUMMARY OF THE INVENTION

In carrying out principles of the present invention in accordance with a preferred embodiment thereof, a membrane test probe including a flexible membrane that mounts a group of probe test contacts is automatically tensioned and leveled to provide proper configuration of the membrane area at the probe test contacts. Self leveling is accomplished by mounting a small pressure plate on the inner surface of the membrane in the area of the probe test contacts and pressing against a central point of the pressure plate by a device having a pivotal contact with the central point of the pressure plate. This allows the pressure plate, and accordingly the membrane to which it is secured, to rotate about the pivot point to both planarize the probe test contacts and apply firm downward force to ensure a good electrical contact. A spring urges the pressure post and its pivot point against the pressure plate to provide a required amount of vertical over-travel. The spring force is adjusted by means of an adjustment member also carried in the probe.

BRIEF DESCRIPTION OF THE DRAWINGS

In the accompanying drawings:

FIG. 1 is a sectional view of portions of a test probe embodying principles of the present invention;

FIG. 2 is an exploded view of a glass pressure plate, a pivot point and spring elements of the levelizing arrangement of the probe of FIG. 1, showing a modified pressure plate; and FIG. 3 shows the elements of FIG. 2 assembled to a test probe membrane.

DESCRIPTION OF THE PREFERRED EMBODIMENTS

Illustrated in FIG. 1 are portions of a membrane probe that are fundamentally the same as those described in full detail in the above-identified co-pending applications of John Pasiecznik, Jr. and Blake F. Woith and William R. Crumly (although the rigid backup block of the latter is omitted). A membrane support frame in the form of a rigid annular substrate 10 is fixedly mounted on test equipment support structure 11 and formed of a suitable dielectric material, such as a photo-ceramic material, a polyamide, or a phenolic resin. Secured to the substrate 10, as by an adhesive or other means, is a thin, flexible, transparent membrane 12 upon the lower surface of which, as viewed in the drawings, has been formed a plurality of probe test contact 14 that are electrically connected to conductors 16 formed on the side of the membrane that bears the contacts 14. The membrane is formed of a suitable dielectric material, such as a polyamide. The conductors individually extend from one of the probe contacts radially outwardly to a peripheral portion 18 of the membrane, where individual conductors are connected by means of vias 20 extending through the annular substrate 10 to contact pads or contact elements 22 on the other side of annular substrate 10. The contact elements 22 connect to test circuitry (not shown).

The annular membrane support frame 10 circumscribes a large opening across the entire area of which extends the flexible membrane. Preferably the membrane is stretched tightly across the area circumscribed by the annular substrate 10, but, nevertheless, both initially and increasingly with use, the membrane may tend to stretch and sag and thereby assume an undefined and unpredictable configuration.

The probe card, including the membrane substrate 10 and support structure 11, is arranged to be fixedly secured to a probe test fixture (not shown) that provides signal connections from test fixture circuitry to the individual ones of the probe contacts 14 via the conductor 16, vias 20 and contact pads 22. The probe card may be secured to a test fixture by means and in the manner described in the above identified co-pending applications. When mounted in the test fixture and pressed against an IC chip, the probe contacts will electrically connect to the pads of the chip for transmission of signals to and from the chip pads.

Probe test contacts 14 are all mounted in a substantially central area on the outer (lower as viewed in FIG. 1) surface of the membrane. The intermediate area occupied by the probe test contacts is only a very small portion of the entire unsupported area of the membrane. Covering this small "test" area on the upper or inner surface of the membrane (e.g. behind the test contacts) is a rigid, thin, flat pressure plate 30 which is secured to the inner surface of the membrane at the area of the test probe contacts. Between the pressure plate 30 and membrane 12, and coextensive with the plate 30, is a thin layer of soft elastomer 31 that adheres to both the pressure plate and membrane to restrain all three elements against relative sliding. A rigid plate 32 of glass or other transparent material is formed with a peripheral circular outer flange 34 that rests atop an inner edge of substrate 10 and is held in place by annular lip 36 of support structure 11 that overlies the flange 34. A number of screws 38 extend through the support structure into a ring 39 that is fixedly bonded to the substrate 10, and thereby rigidly secure and clamp the transparent block 32 to the membrane substrate 10. The rigid support block 32 includes a lower section 40 and an upper section 42, both being completely transparent and each including a centrally located bore 44 and 46 respectively extending therethrough in axial alignment with each other and axially aligned with the center of the area of membrane test pads. Upper block portion 42 is fixedly secured to the lower portion 40 by means of a plurality of screws, such as screws 46 threadedly engaged in apertures in the upper surface of lower block 40. Mounted within bore 44 of lower block 40 is a compression spring 50 having an upper end bearing against a force transfer member, such as a flat disc 52 mounted in the lower end of bore 48 of upper block 42. Bore 48 fixedly carries a metal sleeve 49 that is internally threaded to receive the threaded shank of an adjustment screw 56, having a lower end that bears against the flat disc 52, whereby threaded adjustment of the threaded member 56 will adjust the force exerted by spring 50.

The lowermost surface 57 of the lower block 40 is spaced above the inner surface of the membrane and is also spaced above the upper surface of flat glass pressure plate 30, as can be seen in FIG. 1. To transfer force of the spring to the pressure plate and to enable tilting the probe test contacts so as to perform a self leveling pivoting of the pressure plate, a pivot post 58 (see also FIG. 3) is interposed between the lower end of the spring and the glass pressure plate. Pivot post 58 includes a upright, right circular cylindrical shank portion 60 and a lower free end in the form of a hemispherical head 62. Pivot shank 60 is received axially within the coils of the lower end of the spring 50 and integrally connected to the hemispherical free end. The latter, at a lowermost point 64 thereof, makes a point contact with the plate 30a, which presses against intermediate layer 319 of a soft elastomer. The point contact, with contact maintained by the spring pressure, effectively forms a pivotal connection of the pivot post to the pressure plate.

It may be noted that the plate 30a shown in FIGS. 2 and 3 differs from the pressure plate 30 of FIG. 1 in that the latter includes a central hole 66, whereas the plate 30a has no such hole and is continuous across its entire area. In the arrangement shown in FIGS. 2 and 3 the free end of the pivot post contacts the glass pressure plate at substantially a single point and forms a pivot point that enables the glass pressure plate, together with the membrane and its test contacts in the central of the membrane, to pivot about the point 64. In the embodiment illustrated in FIG. 1, wherein the glass pressure plate is formed with a hole 66, the hemispherical free end 62 of the pivot post contacts the edges of the hole and thus stabilizes the position of the pivotal contact between the pivot post and the glass plate. In this arrangement the contact between the pivot post and the pressure plate is not a point, but rather the periphery of the edge of the hole 66 at the surface of the pressure plate. However, in both arrangements there is a very small pivot area of contact that permits rotation of the pressure plate about such pivot area. The presence of the hole 66 helps to maintain the position of the contact pivot point and restrains lateral displacement of the pivot post along the upper surface of the glass pressure plate. In both arrangements the soft elastomer 31,31a allows differential deflection of different ones of test contacts 14, so as to accommodate differences in height of contact pads of a device to be tested.

In use of the described probe the screw 56 is adjusted to provide a selected amount of compression of spring 50. The force of the spring 50 is transmitted to the membrane through the pivot post and pressure plate, and thus effectively tensions the membrane by pressing it and distending it outwardly (downwardly as shown in FIG. 1) to properly shape the membrane and remove distortions. The amount of adjustment of screw 56 determines the amount of overtravel that will be permitted during a test operation. In the course of a test the membrane probe is lowered down upon a wafer to be tested, where the wafer incorporates a number of integrated circuit chips that are to be tested. Each chip to be tested has a plurality of contact pads that are arranged in a desired pattern and configuration. For testing each such chip the test probe contacts 14 of the test probe are arranged in a pattern and configuration that are congruent with the chip contact pad pattern and configuration. Thus, as the test probe is lowered to the chip the membrane probe is oriented and positioned horizontally, in the plane of the chip pads, so as to ensure registration of each of the test probe contacts with a respective one of the chip pads. Final alignment and orientation is made visually, and therefore the blocks 40,42 and the pressure plate 30 are all made of a transparent material.

As the test probe and its probe contacts come down against and contact the pads of the chip under test, pressure is applied through the spring 50, which compresses to a small extent to allow a desired amount of overtravel that attains the desired pressure between the test probe contacts and the chip pads. When the membrane probe contacts touch the pads of the chip to be tested, the central area of the membrane, e.g. the area in which the test contacts 14 are mounted, and also the pressure plate 30 and soft elastomer 31 tilt, that is rotate about the center pivot point 64. This rotation automatically accomplishes an appropriate orientation of the plane of the probe contacts to make this plane precisely aligned with the plane of the chip pad contacts. Simultaneously, the contact applies a firm downward force by virtue of the compression of the spring 50, and the downward force applied to the probe itself by probe supporting equipment (not shown) This ensures the making of a good electrical contact.

The area of the glass pressure plate 30 is slightly greater than the area of the membrane that is covered by the pattern of probe test contacts. For example, the probe test contacts, which may be so-called gold dot projecting features that project downwardly for a small distance below the lower surface of the membrane, cover a square area of approximately 0.25 inches on a side. For such an arrangement of probe contact dots the glass pressure plate may have a size of 0.30 inches on each side and be symmetrically positioned with respect to the pattern of probe dot contacts. In a typical arrangement pressure plate 30 has a thickness of 0.048", elastomer layer 31 is 0.010" thick and membrane 12 is about 0.004" thick.

Although the illustrated tension and spring force adjustment provided by screw 56 and sleeve 49 are useful for many applications, other applications may employ alternative adjustment that eliminates the screw and sleeve. In such an alternative arrangement blocks 40 and 42 are made as a single block of transparent material having a blind hole positioned as is hole 44 and opening at the lower surface, analogous to surface 57, of the block. The blind hole has a depth somewhat greater than the compressed length of spring 50, which is received therein, and disc 52 is positioned between the inner end of the spring and the bottom of the blind hole. By using discs of different thicknesses, in this arrangement, adjustment of spring length and membrane tension is readily accomplished.

It will be seen that there has been described a test probe configuration in which the probe and its contacts are automatically tensioned, properly shaped and automatically leveled by an arrangement which also provides for adjustable pressurized contact between the probe test contacts and the IC chip pads.

What is claimed is:

1. A test probe comprising:

a membrane support frame, an annular substrate fixed to said support frame, a flexible membrane fixed to and stretched tightly across the annular substrate and having inner and outer surfaces, a plurality of test probe contacts on an intermediate area of said outer surface, said test probe contacts being configured and arranged to be pressed against contact pads of a device to be tested, a plurality of conductive traces on said membrane connected to respective ones of said probe test contacts and configured and arranged for connection to test circuitry, and self-tensioning resilient pressure means connected between said support frame and said membrane intermediate area for exerting a resilient force on said membrane intermediate area that tensions and outwardly distends said membrane intermediate area, said resilient pressure means including means for providing a predetermined amount of overtravel, said self-tensioning resilient pressure means comprising a pressure plate secured to said membrane inner surface at said intermediate area, and means for pivotally pressing against said pressure plate at a pivot area located substantially centrally of said pressure plate, said means for pivotally pressing against said pressure plate comprising a center post having an end that pivotally contacts said pressure plate pivot area, and a compressed spring coaxial with said center post.

2. The probe of claim 1 including means for axially adjusting said spring.

3. The probe of claim 1 including adjustment means for adjustably compressing said spring.

4. A test probe comprising:

a membrane support frame, an annular substrate fixed to said support frame, a flexible membrane fixed to and stretched tightly across the annular substrate and having inner and outer surfaces, a plurality of test probe contacts on an intermediate area of said outer surface, said test probe contacts being configured and arranged to be pressed against contact pads of a device to be tested, a plurality of conductive traces on said membrane connected to respective ones of said probe test contacts and configured and arranged for connection to test circuitry, and self-tensioning resilient pressure means connected between said support frame and said membrane intermediate area for exerting a resilient force on said membrane intermediate area that tensions and outwardly distends said membrane intermediate area, said self-tensioning resilient pressure means including means for providing a predetermined amount of overtravel, said self-tensioning resilient pressure means further comprising a pressure plate secured to the membrane inner surface at said membrane intermediate area, a support block mounted to said membrane support frame and extending over said membrane area at a distance from said pressure plate, said support block having a bore, a compressed spring in said bore and having an outer end, and a post interposed between said spring and said pressure plate and coaxial with said spring, said post having a free end in pivotal contact with said pressure plate.

5. The test probe of claim 4 wherein said post includes a shank received in said spring, and wherein said post free end comprises a head having a curved outer surface that pivotally contacts said pressure plate at a pivot area on a central portion of said pressure plate.

6. The test probe of claim 5 wherein said bore includes an internally threaded portion remote from said spring, an adjustment member threaded in said bore, and a force transfer member in said bore between said threaded member and said spring.

7. The test probe of claim 5 wherein said intermediate area is very small compared to the entire area of the membrane.

8. The test probe of claim 5 including means for restraining relative sliding motion of said post head and said pressure plate.

9. The test probe of claim 8 wherein said means for restraining comprise a small hole in said pressure plate receiving part of said curved outer surface.

10. A test probe comprising:

a membrane support frame, an annular substrate fixed to said support frame, a flexible membrane fixed to and stretched tightly across the annular substrate and having inner and outer surfaces, a plurality of test probe contacts on an intermediate area of said outer surface, said test probe contacts being configured and arranged to be pressed against contact pads of a device to be tested, a plurality of conductive traces on said membrane connected to respective ones of said probe test contacts and configured and arranged for connection to test circuitry, and self-tensioning resilient pressure means connected between said support frame and said membrane intermediate area for exerting a resilient force on said membrane intermediate area that tensions and outwardly distends said membrane intermediate area, said resilient pressure mans including means for providing a predetermined amount of overtravel, said self-tensioning resilient pressure means comprising a pressure plate secured to said membrane inner surface at said intermediate area, a rigid support block rigidly connected to said membrane support frame and having a bore aligned with said pressure plate, a pivot post in said bore having an outer end in contact with said pressure plate, an adjustment screw threadedly mounted in said bore, and a compression spring coaxial with said pivot post in said bore adjustably compressed between said screw and said pivot post, whereby said screw, spring and post adjustably tension said membrane intermediate area and tend to resiliently distend said membrane intermediate area outwardly and provide a predetermined amount of overtravel.

11. The test probe of claim 10 wherein said test probe contacts cover a small area of said membrane, and wherein said annular substrate has a diameter that is many times greater than the small area of the membrane covered by said test probe contacts.

* * * * *